(12) United States Patent
Farooq et al.

(10) Patent No.: US 8,415,238 B2
(45) Date of Patent: Apr. 9, 2013

(54) THREE DIMENSIONAL INTEGRATION AND METHODS OF THROUGH SILICON VIA CREATION

(75) Inventors: Mukta G. Farooq, Hopewell Junction, NY (US); Emily R. Kinser, Hopewell Junction, NY (US); Richard Wise, Hopewell Junction, NY (US); Hakeem Yusuff, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 309 days.

(21) Appl. No.: 12/687,282

(22) Filed: Jan. 14, 2010

(65) Prior Publication Data

US 2011/0171827 A1  Jul. 14, 2011

(51) Int. Cl.
*H01L 21/425* (2006.01)
*H01L 21/4763* (2006.01)
*H01L 21/768* (2006.01)

(52) U.S. Cl.
USPC .... 438/525; 438/533; 438/622; 257/E21.575; 257/E21.586

(58) Field of Classification Search ............... 438/514, 438/524, 525, 533, 618, 620, 622, 627, 628, 438/638, 639, 643, 644, 652–655; 257/E21.575, 257/E21.584–E21.586
See application file for complete search history.

(56) References Cited

U.S. PATENT DOCUMENTS

| | | | |
|---|---|---|---|
| 5,904,495 A * | 5/1999 | Burke et al. | 438/98 |
| 5,915,167 A | 6/1999 | Leedy | |
| 5,937,324 A | 8/1999 | Abercrombie et al. | |
| 6,133,640 A | 10/2000 | Leedy | |
| 6,187,657 B1 * | 2/2001 | Xiang et al. | 438/596 |
| 6,208,545 B1 | 3/2001 | Leedy | |
| 6,500,755 B2 | 12/2002 | Dakshina-Murthy et al. | |
| 6,551,857 B2 | 4/2003 | Leedy | |
| 6,563,224 B2 | 5/2003 | Leedy | |
| 6,632,706 B1 | 10/2003 | Leedy | |
| 6,664,500 B2 | 12/2003 | Wilbur et al. | |
| 6,790,782 B1 | 9/2004 | Yang et al. | |
| 6,808,942 B1 | 10/2004 | Patel et al. | |
| 6,858,361 B2 | 2/2005 | Mui et al. | |
| 6,900,139 B1 | 5/2005 | Dakshina-Murthy et al. | |

(Continued)

FOREIGN PATENT DOCUMENTS

| | | |
|---|---|---|
| CN | 1525485 | 4/1998 |
| CN | 101188235 | 4/1998 |

(Continued)

OTHER PUBLICATIONS

English Abstract of JP2009032992(A) data supplied from the esp@cenet database Worldwide.

*Primary Examiner* — Charles Garber
*Assistant Examiner* — Calvin Choi
(74) *Attorney, Agent, or Firm* — Cantor Colburn LLP; Katherine Brown

(57) ABSTRACT

A method includes patterning a photoresist layer on a structure to define an opening and expose a first planar area on a substrate layer, etching the exposed planar area to form a cavity having a first depth in the structure, removing a second portion of the photoresist to expose a second planar area on the substrate layer, forming a doped portion in the second planar area, and etching the cavity to expose a first conductor in the structure and the doped portion to expose a second conductor in the structure.

4 Claims, 20 Drawing Sheets

U.S. PATENT DOCUMENTS

| | | |
|---|---|---|
| 6,924,088 B2 | 8/2005 | Mui et al. |
| 6,949,830 B2 | 9/2005 | Owada et al. |
| 6,953,722 B2 | 10/2005 | Seidl et al. |
| 7,041,434 B2 | 5/2006 | Raebiger et al. |
| 7,081,408 B2 | 7/2006 | Lane et al. |
| 7,132,340 B2 | 11/2006 | Sadra et al. |
| 7,138,295 B2 | 11/2006 | Leedy |
| 7,151,055 B2 | 12/2006 | Aminpur et al. |
| 7,176,126 B2 | 2/2007 | Oh et al. |
| 7,193,239 B2 | 3/2007 | Leedy |
| 7,320,927 B2 | 1/2008 | DeLoach et al. |
| 7,402,515 B2 | 7/2008 | Arana et al. |
| 7,453,150 B1 | 11/2008 | McDonald |
| 7,474,004 B2 | 1/2009 | Leedy |
| 7,504,732 B2 | 3/2009 | Leedy |
| 7,538,032 B2 | 5/2009 | Borwick et al. |
| 7,705,466 B2 | 4/2010 | Leedy |
| 2002/0132465 A1 | 9/2002 | Leedy |
| 2003/0173608 A1 | 9/2003 | Leedy |
| 2006/0024948 A1* | 2/2006 | Oh et al. .................. 438/622 |
| 2007/0042599 A1 | 2/2007 | Tsui et al. |
| 2007/0045779 A1 | 3/2007 | Hiatt |
| 2007/0087504 A1* | 4/2007 | Pham et al. .................. 438/257 |
| 2007/0096312 A1 | 5/2007 | Humpston et al. |
| 2007/0138562 A1 | 6/2007 | Trezza |
| 2007/0182014 A1 | 8/2007 | Usami et al. |
| 2008/0153187 A1 | 6/2008 | Luo et al. |
| 2009/0014843 A1 | 1/2009 | Kawashita et al. |
| 2009/0067210 A1 | 3/2009 | Leedy |
| 2009/0174082 A1 | 7/2009 | Leedy |
| 2009/0175104 A1 | 7/2009 | Leedy |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |
| 2011/0076845 A1 | 3/2011 | Tsai et al. |

FOREIGN PATENT DOCUMENTS

| | | |
|---|---|---|
| CN | 98803836 | 6/2004 |
| EP | 0975472 | 4/1998 |
| EP | 1986233 | 4/1998 |
| JP | 10-543031 | 4/1998 |
| JP | 2008028407 | 8/2007 |
| JP | 2008166831 | 7/2008 |
| JP | 2008166832 | 7/2008 |
| JP | 2008172254 | 7/2008 |
| JP | 2009-032992 A | 2/2009 |
| KR | 10-0639752 | 10/2006 |
| KR | 10-0785821 | 12/2007 |
| TW | 412854 | 11/2000 |

* cited by examiner

THREE DIMENSIONAL INTEGRATION AND METHODS OF THROUGH SILICON VIA CREATION

BACKGROUND

The present invention relates to semiconductor device manufacturing techniques, specifically fabrication of through silicon vias (TSVs) with multiple diameters.

In the electronics industry, packaging density continuously increases in order to accommodate more electronic devices into a package. In this regard, three-dimensional (3D) stacking technology of wafers and/or chips contributes to the device integration process. Typically, a semiconductor wafer (a semiconductor device/substrate) or chip (a semiconductor device) includes several layers of integrated circuitry (e.g., processors, programmable devices, memory devices, etc.) built on a silicon substrate. A top layer of the wafer may be connected to a bottom layer of the wafer through silicon interconnects or vias. Typical vias include metallic material formed in cavities in the semiconductor that electrically connect conductive contacts disposed in different areas of a device. In order to form a 3D wafer stack, two or more wafers are placed on top of one other and bonded together.

Previous methods for electrically connecting the wafers used vias that consumed geometric space on the wafers or chips by connecting multiple vias of a single diameter utilizing additional wiring levels. Alternately, the formation of TSVs with complex shapes, such as multiple diameters in a single TSV, used inefficient fabrication methods utilizing additional mask layers and patterning steps, which added cost, complexity, and process time to the manufacturing process.

BRIEF SUMMARY

According to one embodiment of the present invention, a method includes patterning a photoresist layer on a structure to define an opening and expose a first planar area on a substrate layer, etching the exposed planar area to form a cavity having a first depth in the structure, removing a second portion of the photoresist to expose a second planar area on the substrate layer, forming a doped portion in the second planar area, and etching the cavity to expose a first conductor in the structure and the doped portion to expose a second conductor in the structure.

According to another exemplary embodiment of the present invention, a method includes patterning a photoresist layer on a structure to define an opening and expose a first planar area on a sacrificial substrate layer, etching to the exposed first planar area to form a cavity having a first depth in the structure, removing a portion of the photoresist to increase the size of the opening to define a second planar area on the sacrificial substrate layer, forming a doped portion in the sacrificial substrate layer, and etching the cavity to increase the depth of the cavity to expose a first conductor in the structure and to increase the planar area and depth of a portion of the cavity to expose a second conductor in the structure.

According to yet another exemplary embodiment of the present invention, a method includes patterning a photoresist layer on a structure to define an opening and expose a first planar area on a substrate layer, forming doped portions of the substrate layer in the first planar area, removing a portion of the photoresist to form a second opening defining a second planar area on the substrate layer, and etching to form a first cavity having a first depth defined by the first opening to expose a first contact in the structure and to form a second cavity defined by the second opening to expose a second contact in the structure.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The drawings are not necessarily drawn to scale. The forgoing and other features, and advantages of the invention are apparent from the following detailed description taken in conjunction with the accompanying drawings in which:

DETAILED DESCRIPTION

Figure 1:
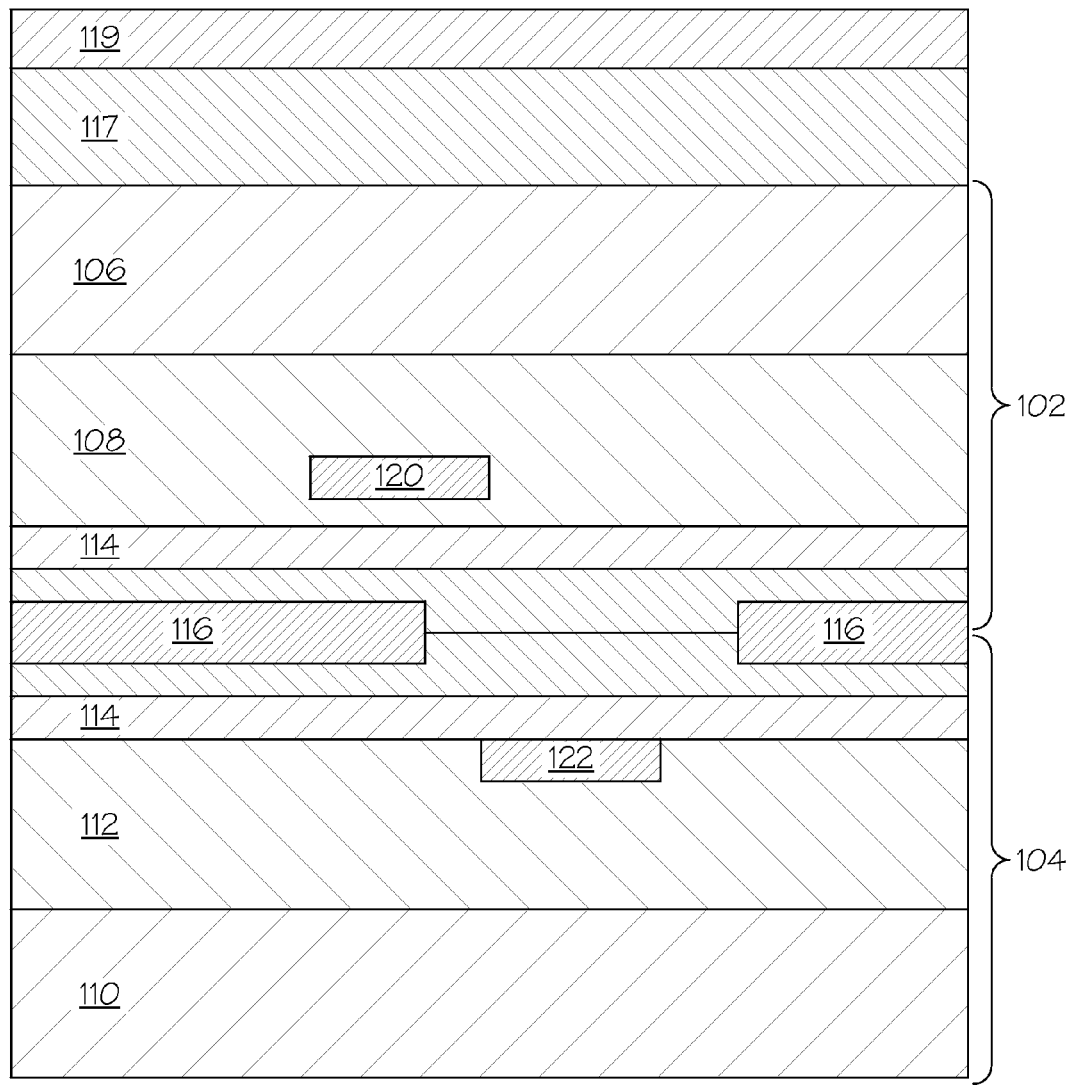
FIG. 1 illustrates a side cut away view of an exemplary embodiment of a portion of a three-dimensional interconnect (IC) structure having multiple bonded silicon substrates.

FIG. 1 illustrates a cross section view of an exemplary embodiment of a portion of a three-dimensional interconnect (3D IC) structure having a first component 102 arranged on a second component 104. The first component 102 and second component 104 may represent a portion of a silicon wafer or chip, in which the wafer or chip include a front-end-of-line (FEOL), middle-of-line (MOL), and back-end-of-line (BEOL) structures formed thereon, as known in the art. The first component 102 includes a substrate portion 106, and a wiring level portion 108, which may include, for example, a conductive line embedded in a dielectric layer. The substrate portion 106 includes a semiconductor material, which may be a single crystalline substrate which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The second component 104 is similar to the first component 102, and includes a substrate portion 110 and a wiring level portion 112. Cap layers 114, for example, nitride layers of, for example, a silicon nitride material, may be arranged on the top surfaces of wiring level portions 108 and 112. For illustrative purposes, one capping layer per wiring level is depicted, although it is understood to those practicing in the art that additional capping layers may be dispersed throughout the bonded 3D IC structure. The top surface of second component 104 and the top surface of first component 102 can be brought together in "face-to-face" arrangement and may be bonded by a bonding material 116 comprising, for example, an adhesive or a metallic layer such as, for example copper, or bonded with an oxide-oxide process, or other bonding process known in the art. Alternate orientations of the three-dimensional IC structure may include, for example back-toface bonding wherein an exposed top surface of a first component is bonded to a substrate portion of another second component. The arrangements may include an oxide or dielectric layer, which is not shown, deposited on first component 102 substrate portion 106. The substrate portion 106 may be relatively thinner than the substrate portion 110 of the second component 104. The first component 102 includes at least one conductive contact 120, and the second component 104 includes at least one conductive contact 122, where both conductive contacts are fabricated prior to the bonding of component 102 and component 104.

Though the illustrated embodiments include a 3D IC structure in a face-to-face arrangement of two bonded components, alternate embodiments may include any number of bonded components, which can be arranged, for example, face-to-face, face-to-back, or back-to-back. An optical planarization layer (OPL) 117 is deposited on an exposed surface of the bonded 3D IC. FIG. 1 illustrates layer 117 deposited on substrate portion 106 (i.e., the "back" of component 102) but in alternate arrangements 117 could be deposited on an exposed 'top' surface of a component. Sacrificial silicon layer 119 may be deposited on the top surface of ODL layer 117. ODL layer 117 may include any material that functions as an optical planarization layer known in the art, such as, for example, amorphous carbon. Sacrificial silicon layer 119 may also be relatively thinner than substrate portions 106 and 110.

Figure 2A:
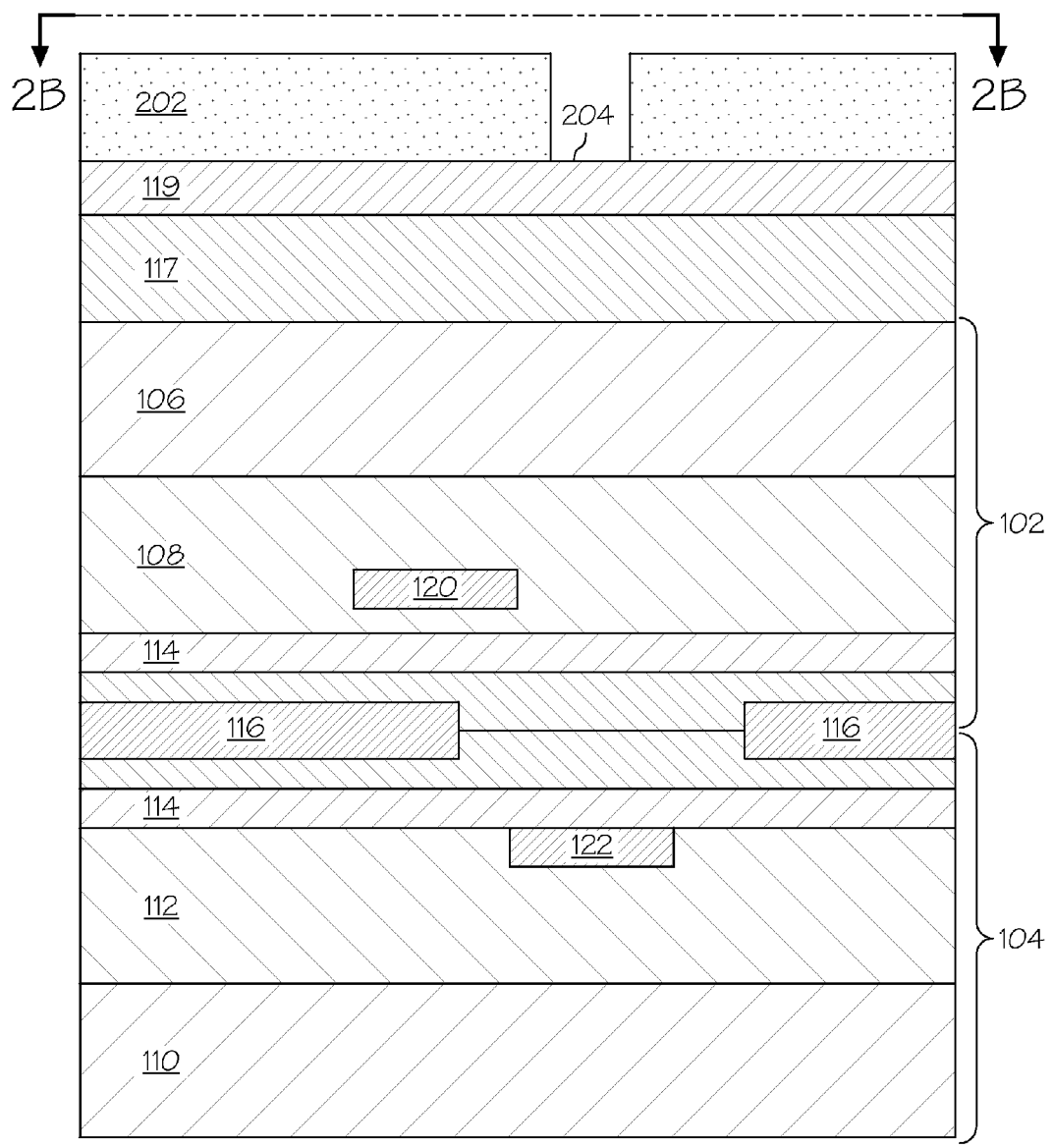
FIGS. 2A-9 illustrate exemplary methods for forming a through silicon via (TSV) in the IC structure of FIG. 1.
Figure 2B:
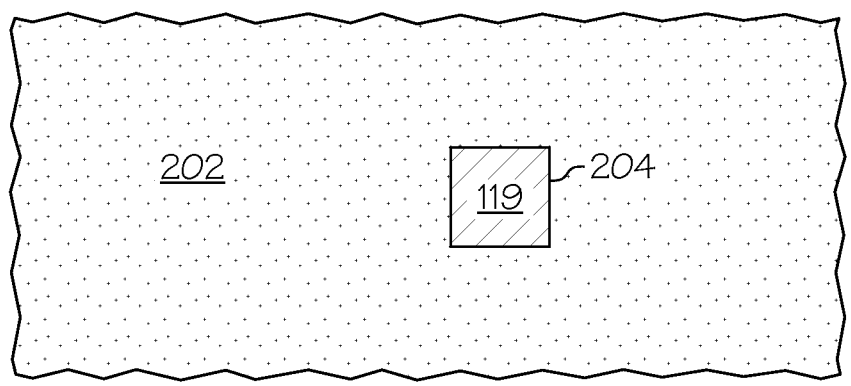

The FIGS. 2A-9 illustrate an exemplary method for forming a TSV in the 3D IC structure described above. In this regard, FIG. 2A illustrates a photoresist layer 202 deposited on the sacrificial silicon layer 119. The photoresist layer 202 is patterned to define an opening 204 that exposes a first planar area of the sacrificial silicon layer 119. FIG. 2B illustrates a top view along the line A-A (of FIG. 2A) of a portion of the photoresist layer 202 including opening 204.

Figure 3:
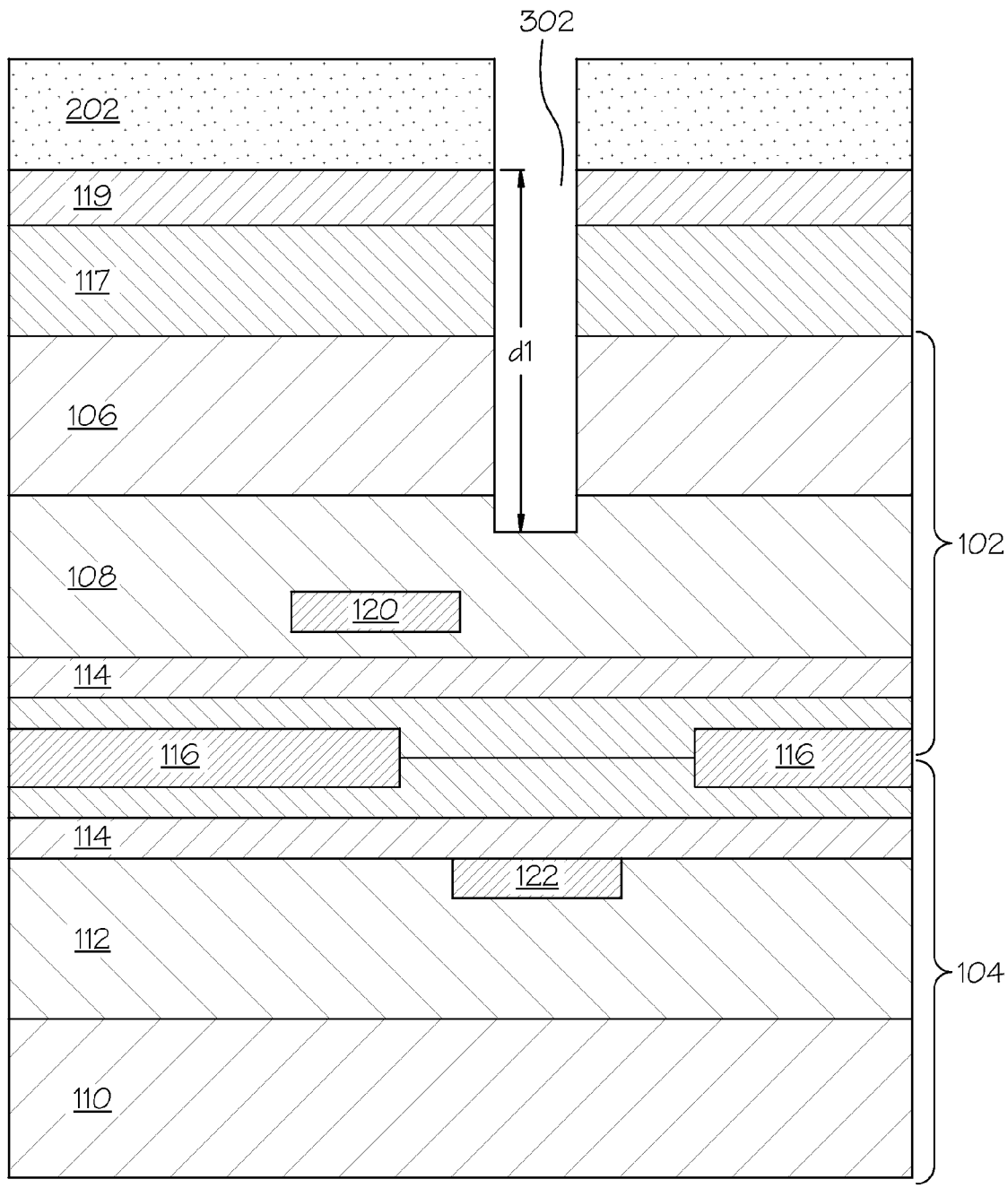

FIG. 3 illustrates a cavity 302 etched to a first depth (d1). The TSV cavity 302 may be etched using any suitable etching process such as, for example, a reactive ion etching (RIE) process. In the illustrated embodiment, the etching process is timed to form the TSV cavity 302 having the desired first depth (d1). The first depth (d1) may be determined by the thickness of the first component 102, the thickness of the second component 104, the locations of the conductive contacts, and the anisotropy of the etch process.

Figure 4:
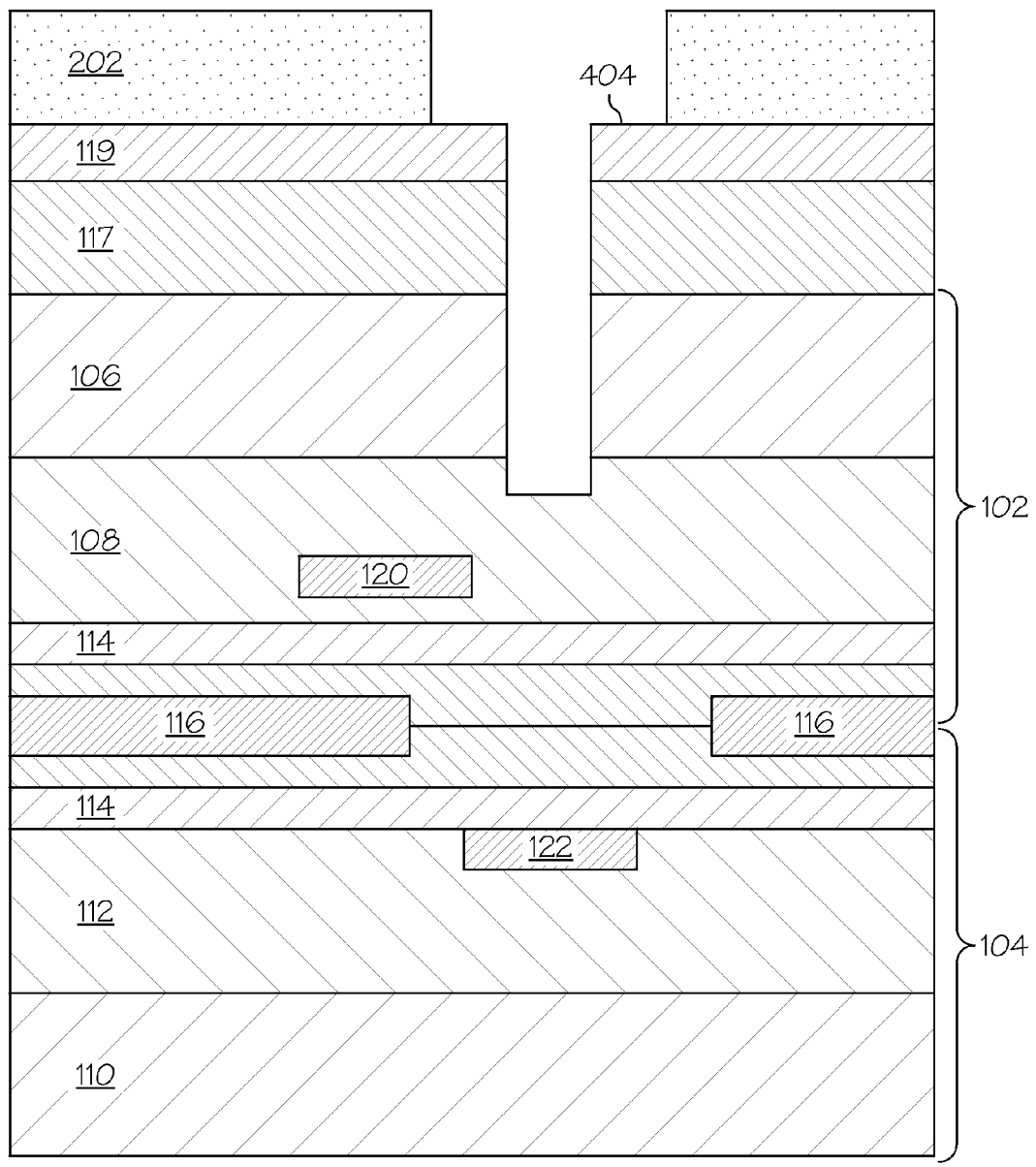

FIG. 4 illustrates an opening 404 that is defined by the photoresist layer 202. The opening exposes a second planar area of the sacrificial silicon layer 119. The opening 404 is formed by removing a portion of the photoresist layer 202 by, for example, an in-situ $O_2$ flash process that increases the size of the opening 204 (of FIG. 2A). In the illustrated embodiment, the $O_2$ flash process also reduces the thickness of the photoresist layer 202. The opening 204 may be increased in place ("in-situ" without removing the device from the tooling) by using other gases known in the art, including, for example, $CO_2$, CO, $N_2/H_2$, and any combination of all of these gases in optimized flow ratios. Such etch processing conditions and parameters that enhance lateral etch can be manipulated in-situ to efficiently attain a desired opening 204 specifications.

Figure 5A:
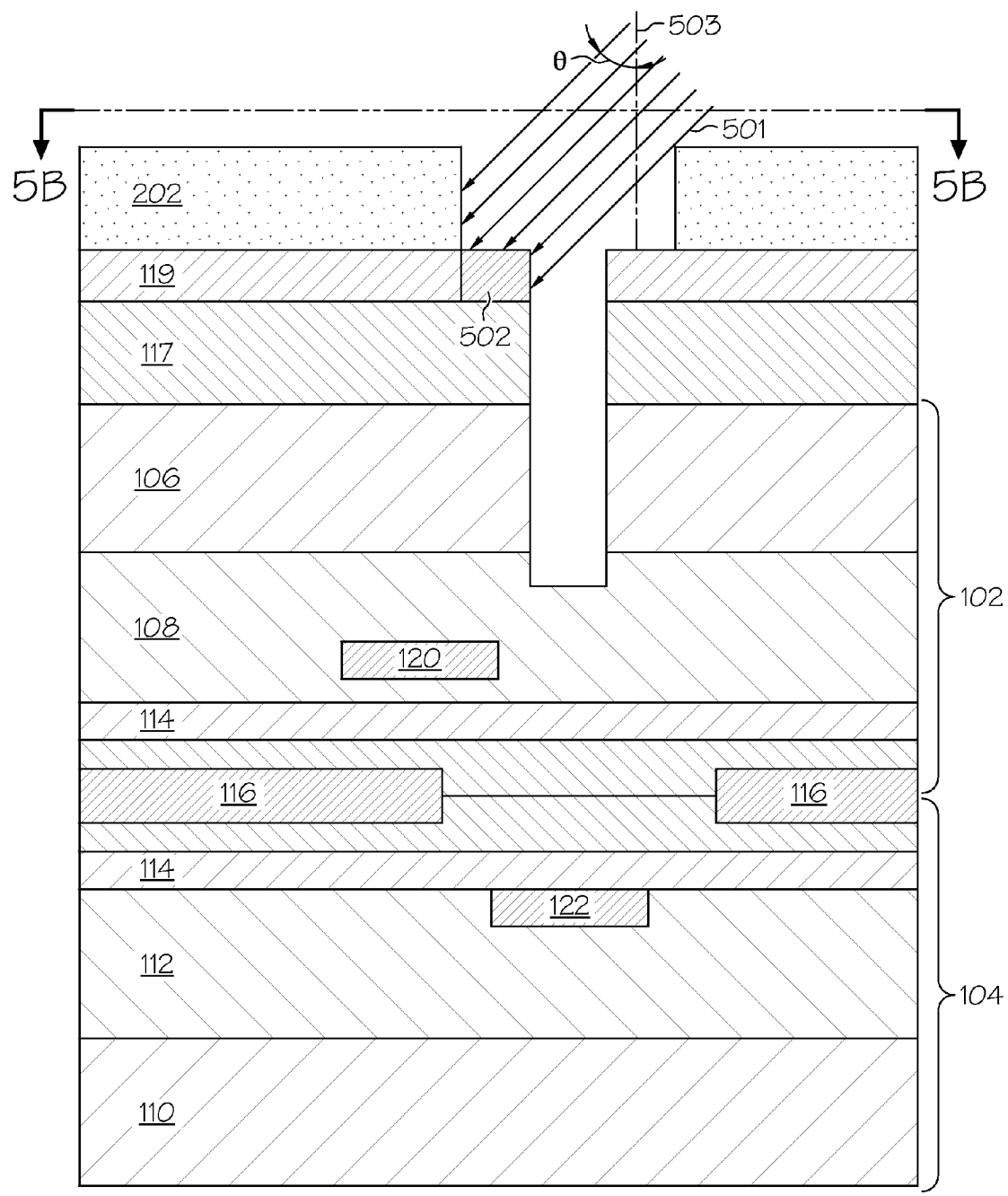

FIG. 5A illustrates an implantation of ions 501 in a doped region 502 of the sacrificial silicon layer 119. The ions 501 are implanted at an angle (θ) relative to a normal line 503. The implantation at the angle (θ) defines the doped region 502, and lowers the amount of ions implanted in other exposed regions of the sacrificial silicon layer 119. The angle (θ) may include any number of angles to define the desired doped region 502 geometry, for example, 95 degrees to 175 degrees.

Figure 5B:
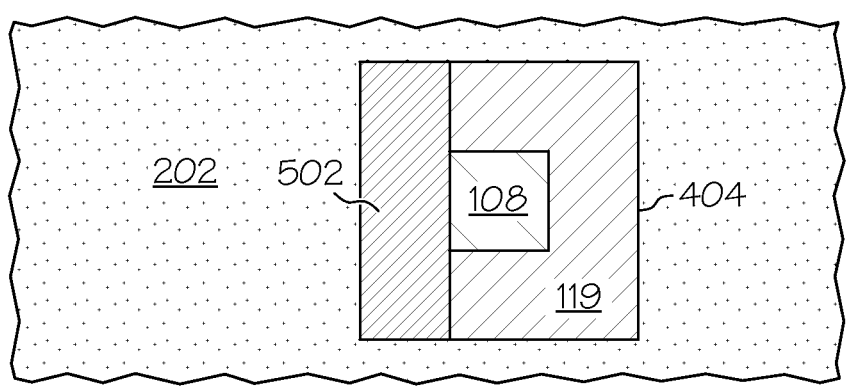

FIG. 5B illustrates a top view along the line A-A (of FIG. 5A) of a portion of the photoresist layer 202 and the opening 404. N-doping or similar Group V doping elements can be used for the ions 501 to dope the doped region 502. When etched, the doped region 502 etches faster than undoped regions due to available additional electrons that attach to halogenated etchants (etchants including halogen). The etch chemistry may be chosen to be highly electronegative such that it is selective to the sacrificial silicon layer 119. The anisotropic etch forms a dual-diameter via that has staggered via depths (described below) In an alternate embodiment, p-doping can also be implemented to retard the relative etch rate of the doped region.

Figure 6:
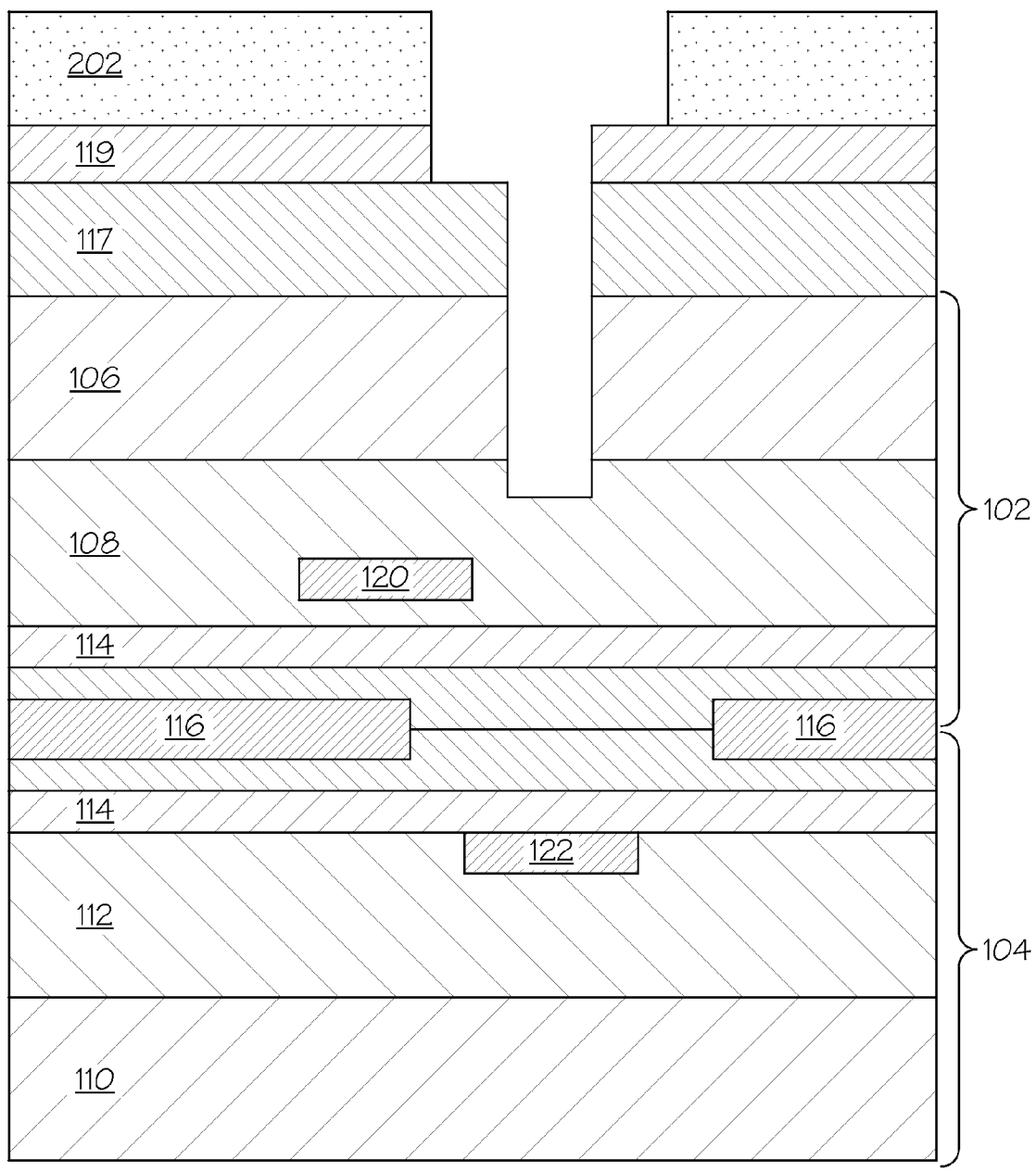

FIG. 6 illustrates the structure following etching of the n-doped region 502 of the sacrificial silicon layer 119. Pressure setting in, for example, the range 30 mTorr to 350 mTorr can be used to achieve this etch. Pressure setting between 75 mTorr and 150 mTorr is used in the illustrated embodiment. Various optimized flow combinations of such gases as $CF_4$, CxHyFz, Cl2, HBr, with additives including $O_2$, $N_2$, and Ar may be used. A halogen-based silicon etchant (F/Cl/Br/I) enhances the influence of the doping level on the etch selectivity. The etch selectively removes the doped region 502 from the sacrificial silicon layer 119, and exposes a portion of the optical planarization layer 117.

Figure 7:
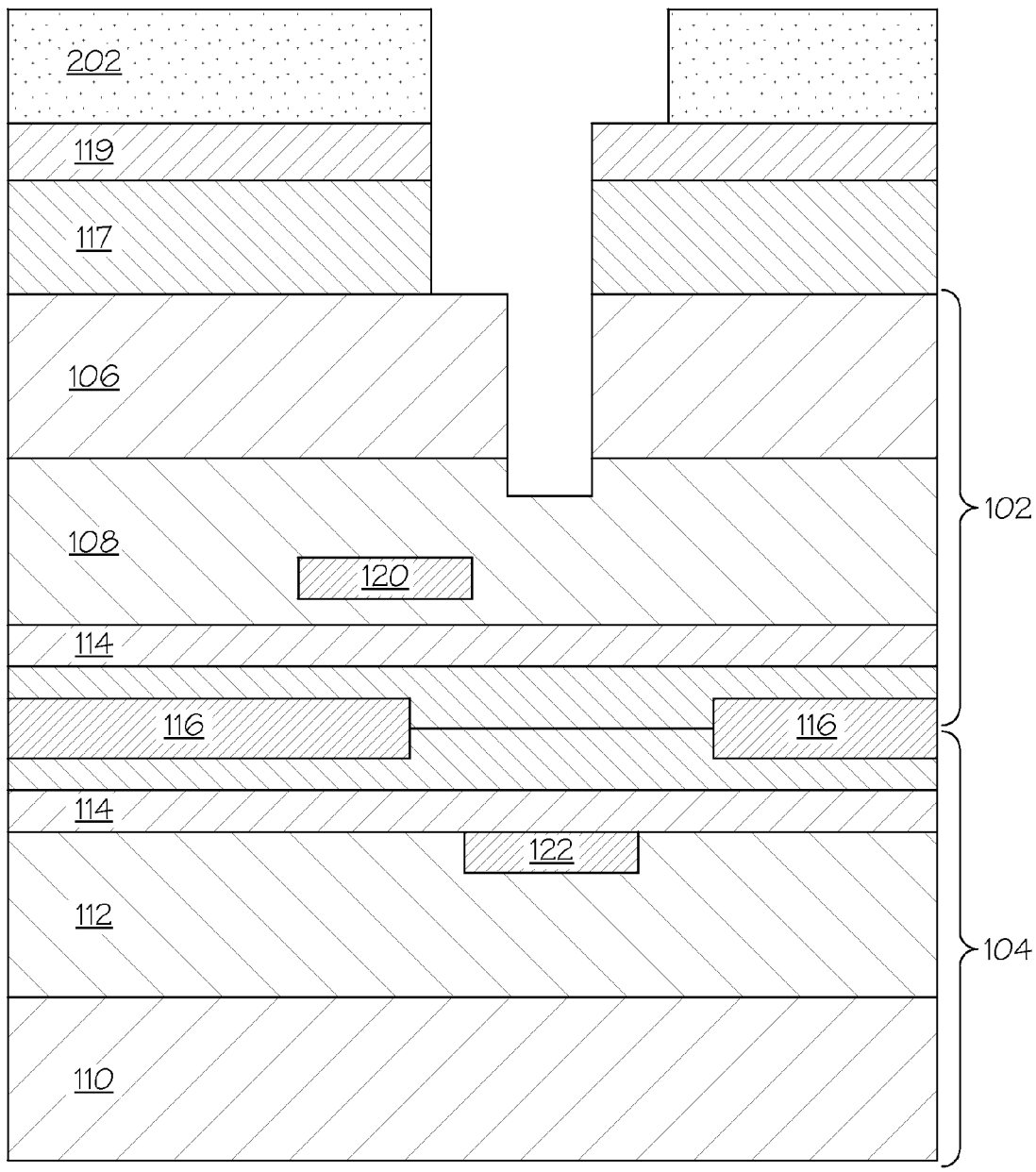

FIG. 7 illustrates a cavity after another etching process that removes a portion of the optical planarization layer 117. Pressure setting in the range 30 mTorr to 350 mTorr can also be used to achieve the etch. A pressure setting between 75 mTorr and 200 mTorr is used in the illustrated embodiment. Various optimized flow combinations of gasses such as, for example, $CF_4$, CxHyFz, $O_2$, $N_2$, $H_2$, and Ar may be used to achieve this etch at a tuned RF power setting.

Figure 8:
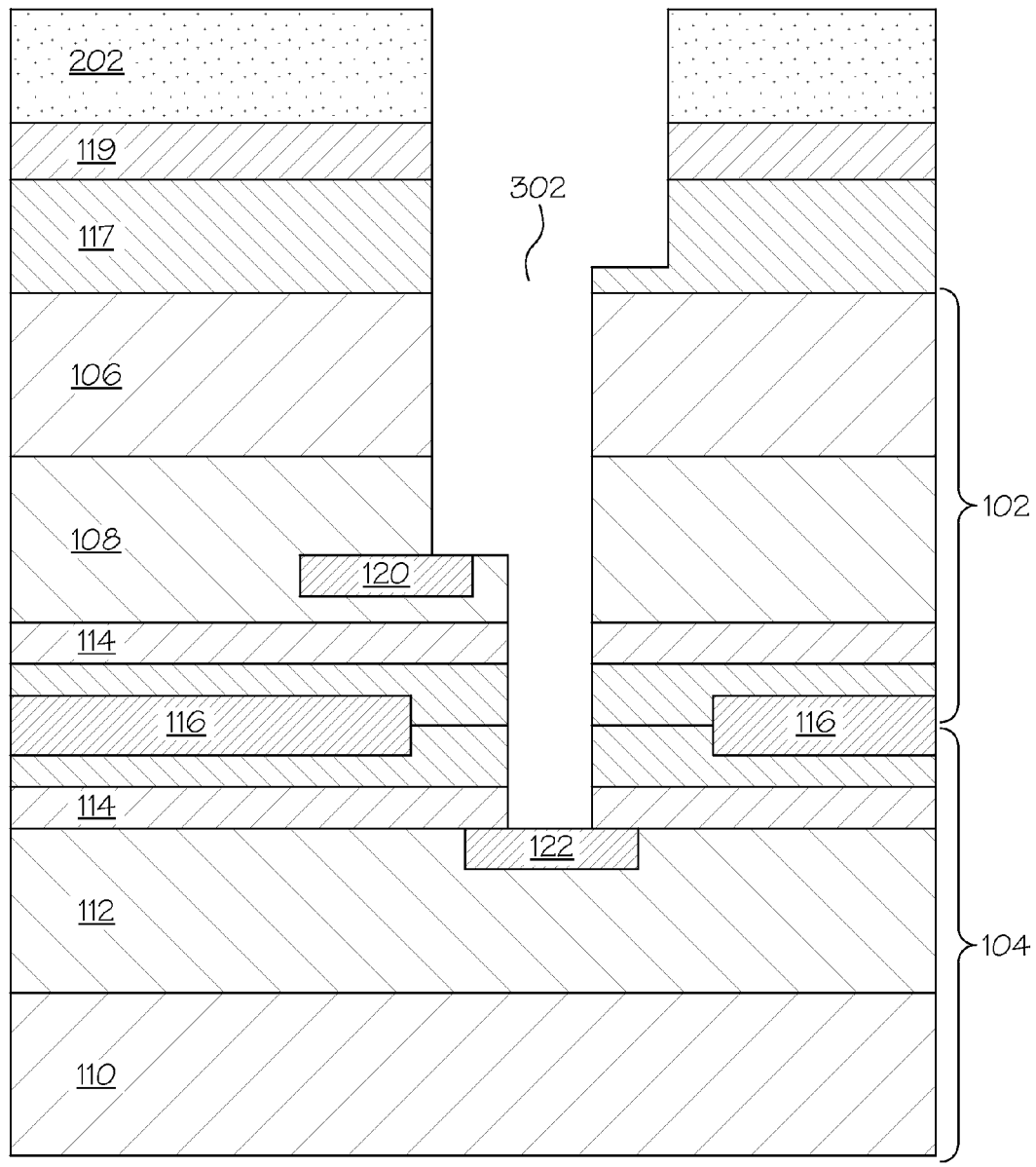

FIG. 8 illustrates an enlarged TSV cavity 302 following an etching process that increases the depth of a portion of the TSV cavity 302 to expose the conductive contact 122, and increases the depth of the TSV cavity 302 that was partially defined by the doped region 502 to expose the conductive contact 120. The etching process removes portions of the sacrificial silicon layer 119 and the optical planarization layer 117. For example, gasses such as $SiF_4$, $SF_6$, Ar, $O_2$, and HBr can be used to achieve the etch.

Figure 9:
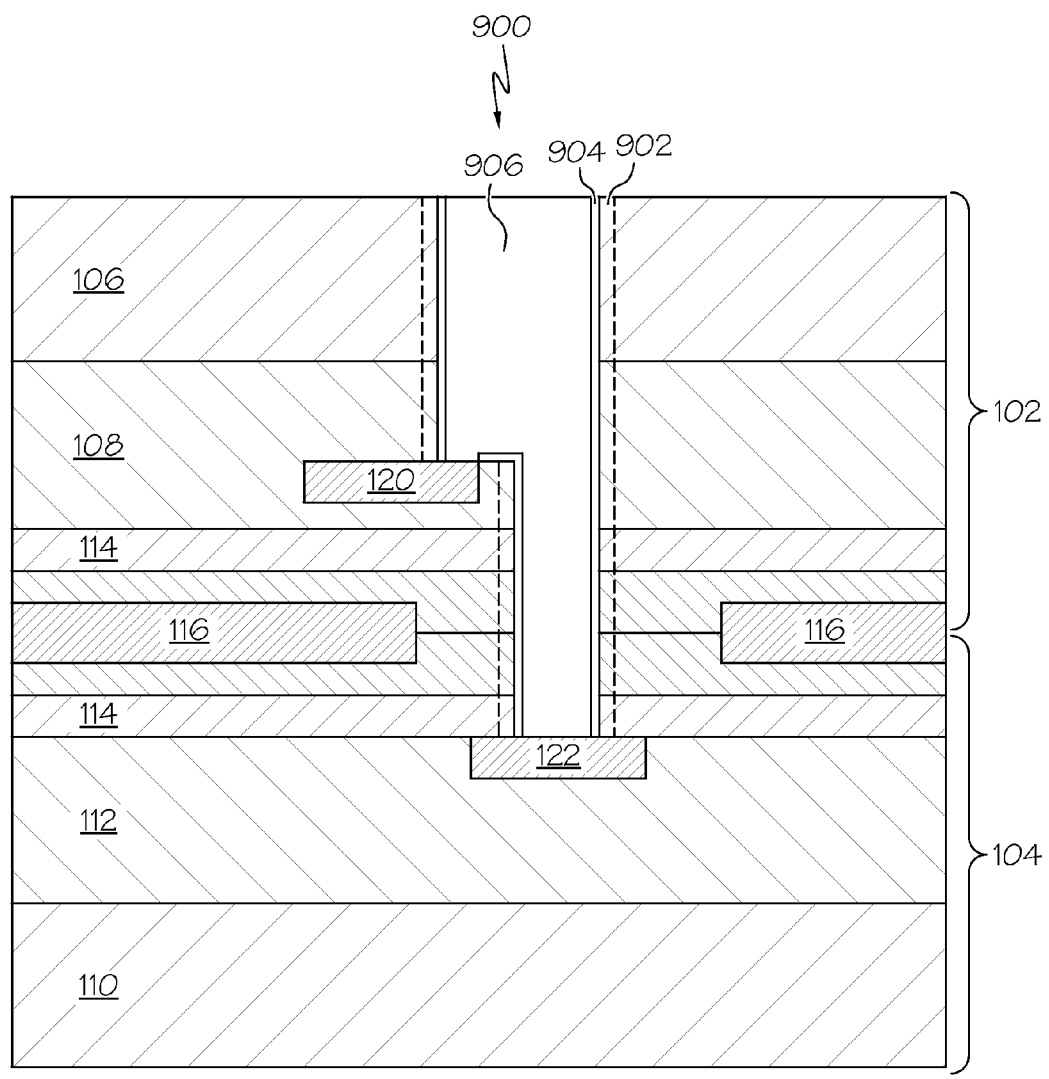

FIG. 9 illustrates a resultant through silicon via [TSV] 900. The via 900 is formed by removing the remaining photoresist layer 202, the sacrificial silicon layer 119, and the optical planarization layer 117. A dielectric isolation region 902 may be formed, and a portion of the dielectric isolation layer is removed to expose portions of the contacts. A barrier/seed layer 904 can be deposited in the TSV cavity 302, and a conductive material 906 such as, for example copper or tungsten, can be deposited in the TSV cavity 302 and then planarized using, for example, a chemical mechanical planarization operation to form the through silicon via 900.

Figure 10:
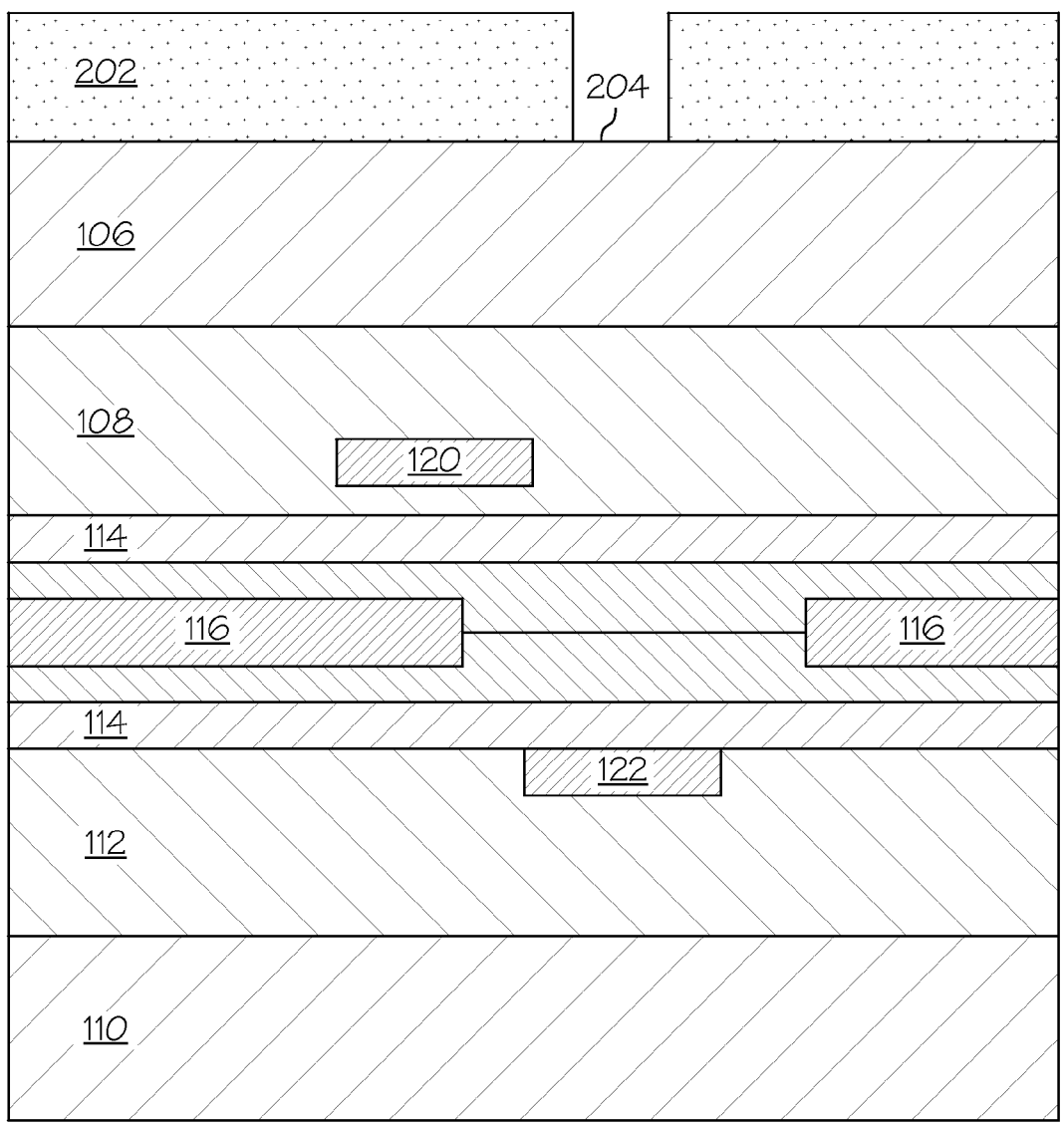
FIGS. 10-13 illustrate an alternate exemplary method for forming a through silicon via interconnects.

FIGS. 10-13 illustrate an alternate exemplary method for forming a via that is similar to the method described above. In FIG. 10, the 3D IC structure is similar to the IC structure of FIG. 2A, however, the illustrated IC structure does not include the optical planarization layer 117 or the sacrificial silicon layer 119. In this regard, the photoresist layer 202 is deposited directly on the substrate portion 106 to define the opening 204 that exposes a portion of the substrate portion 106 having a first planar area. As noted, a 3D IC structure can be arranged within exposed 'top' surface in which case layer 202 can be deposited thereon.

Figure 11:
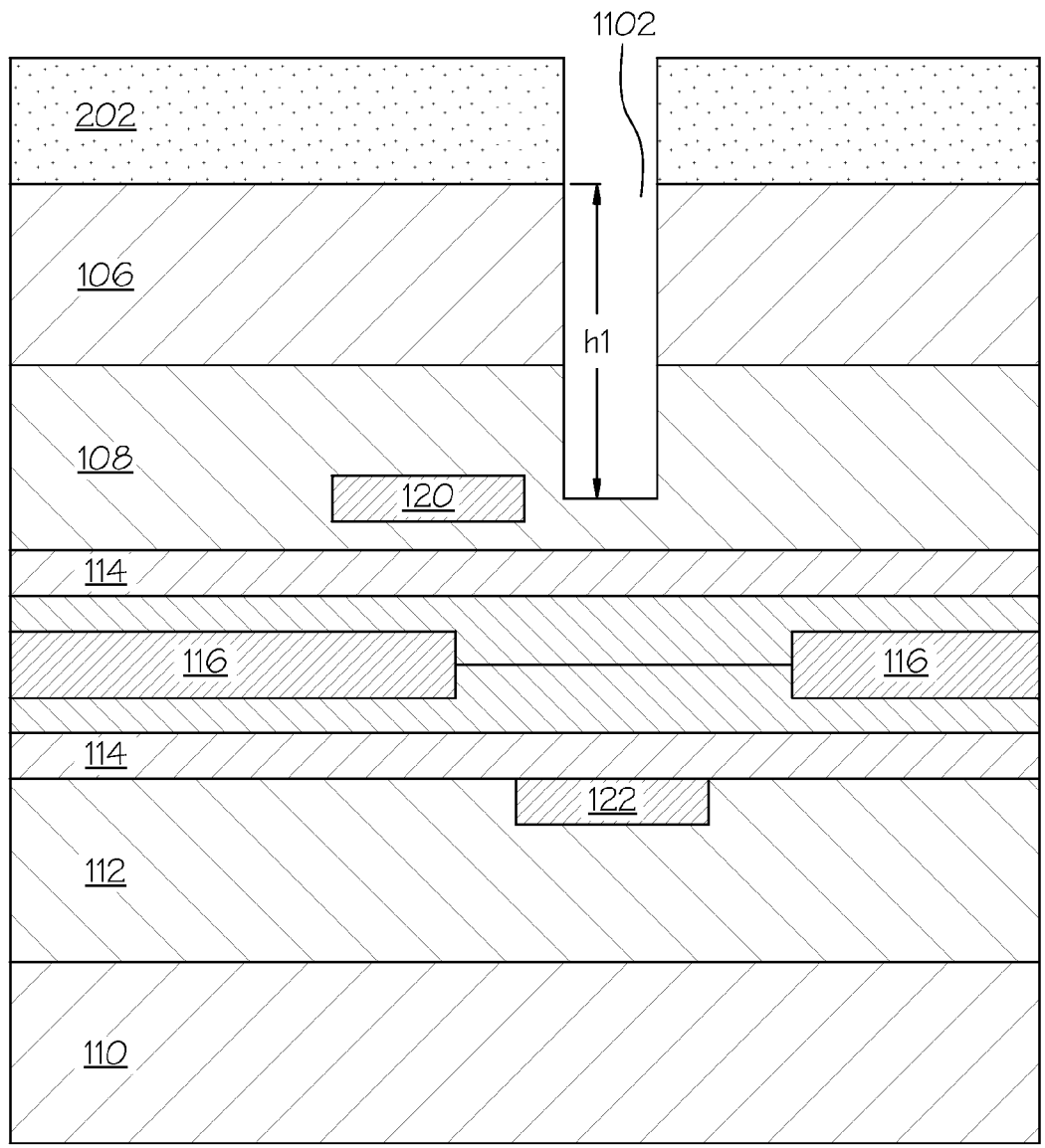

FIG. 11 illustrates a TSV cavity 1102 that is etched to a first depth (h1).

Figure 12:
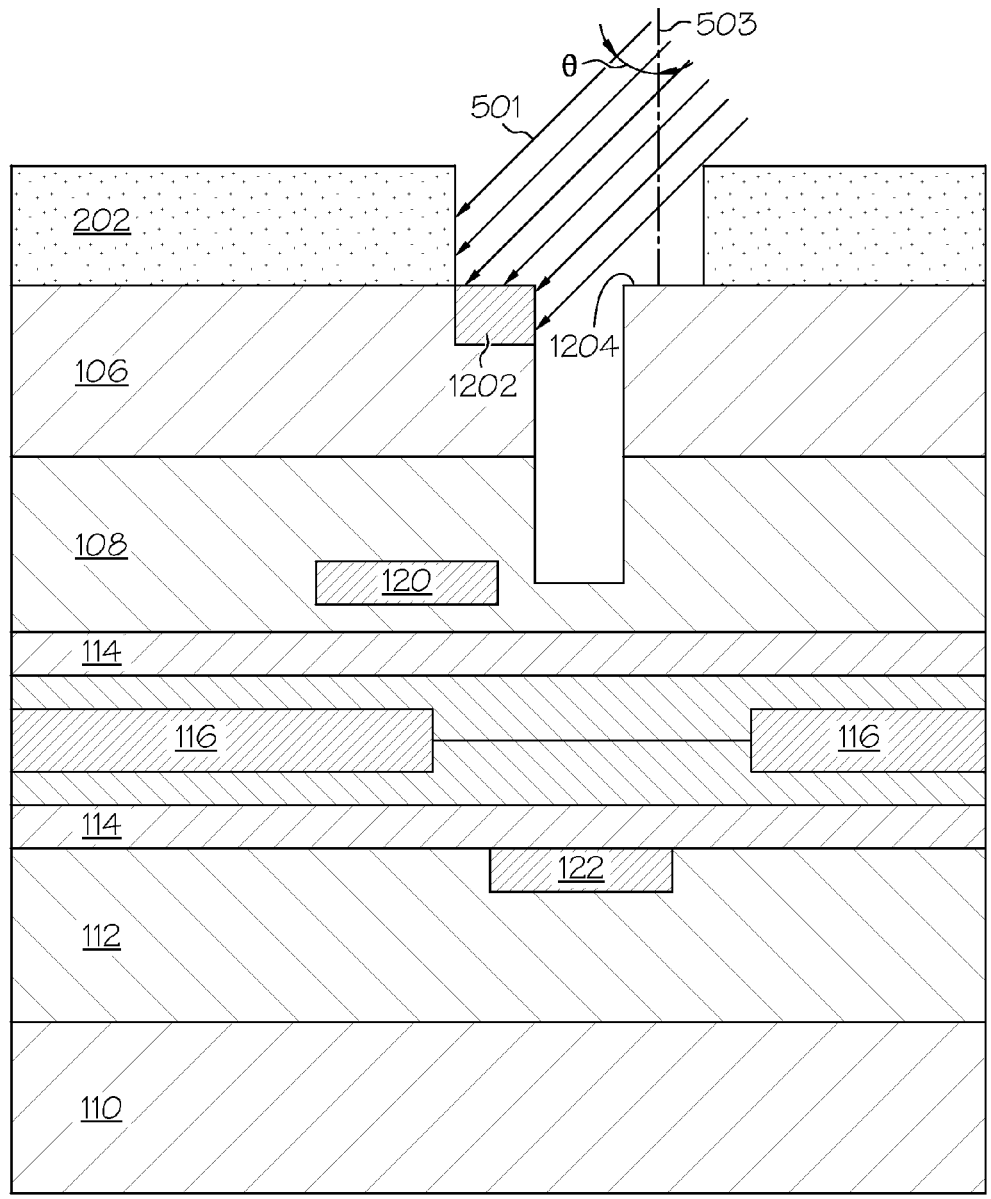

FIG. 12 illustrates an enlarged opening 1204 that is defined by the photoresist layer 202. The opening 1204 exposes a second planar area of the substrate portion 106. The opening 1204 is formed by in-situ removal of a portion of the photoresist layer 202. A doped region 1202 can be formed by the implantation of ions 501 in a portion of substrate portion 106 exposed by opening 1204. The ions 501 are implanted at an angle (θ) relative to a normal line 503 in a similar manner as described above.

Figure 13:
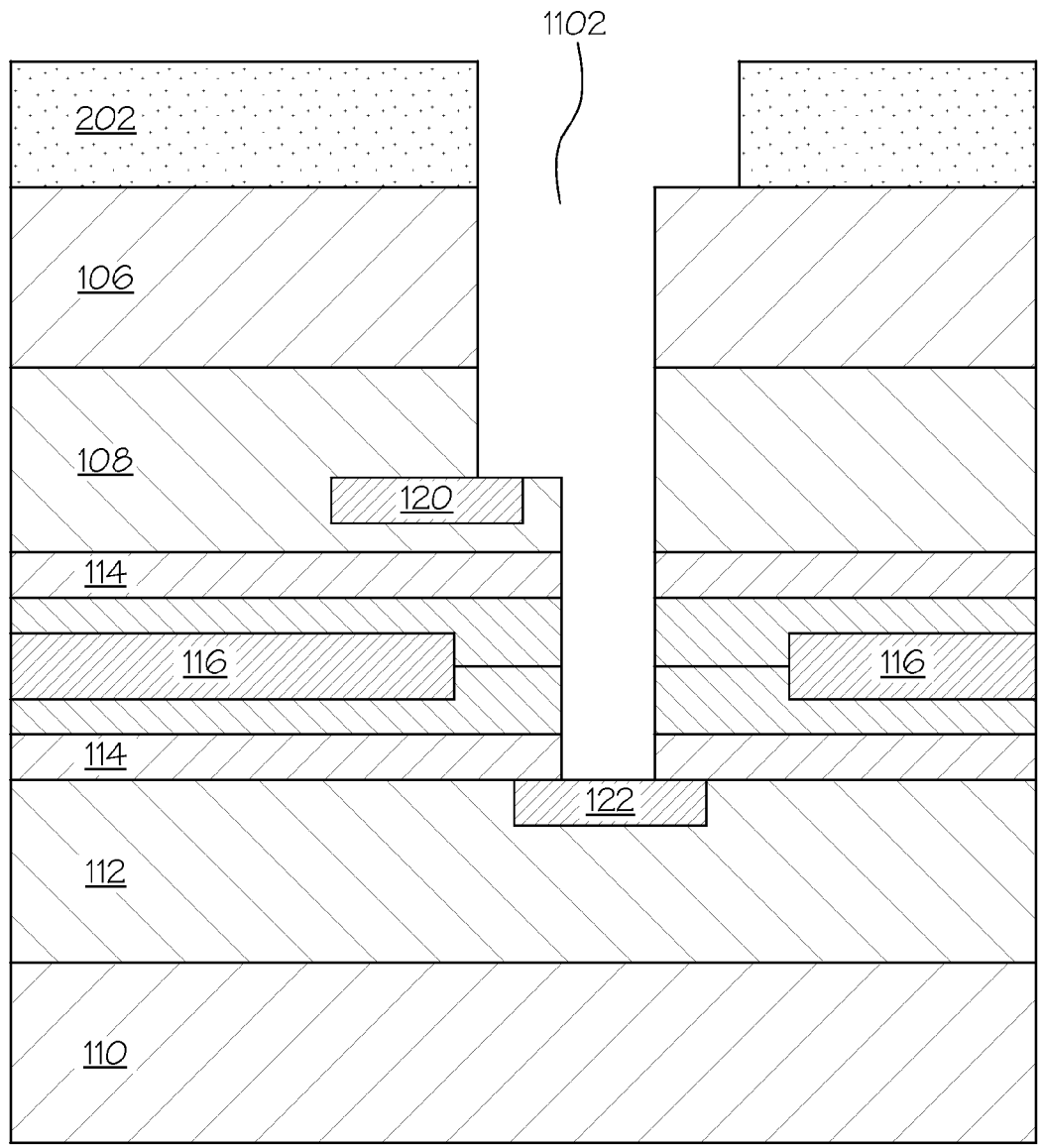

FIG. 13 illustrates the TSV cavity 1102 that is formed by etching to expose the contacts 120 and 122. Once the TSV cavity 1102 is etched to expose the contacts 120 and 122, the photoresist layer 202 may be removed, and a through silicon via may be formed in a similar manner as described above. The resultant TSV is similar to the through silicon via 900 (of FIG. 9).

Figure 14:
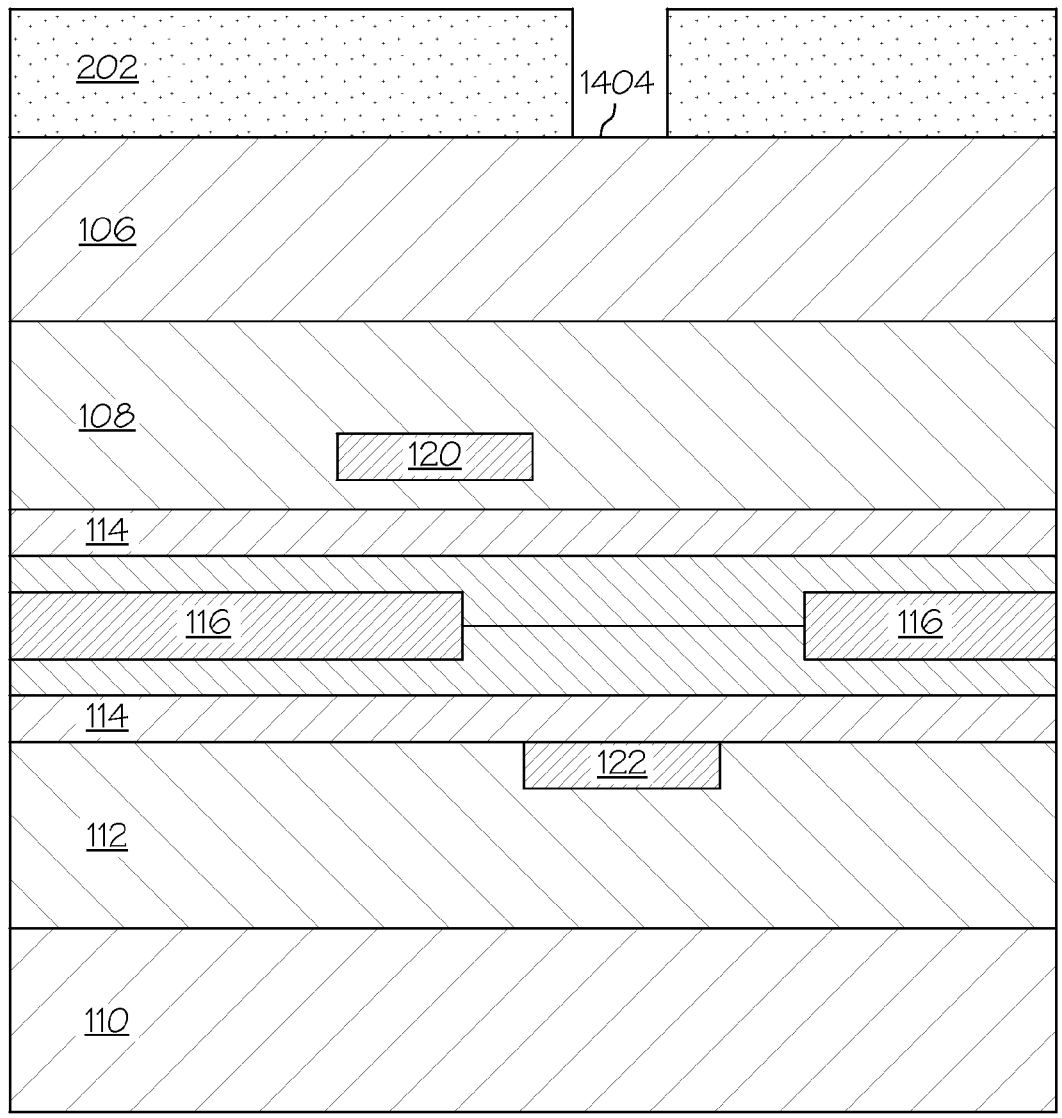
FIGS. 14-18 illustrate yet another alternate embodiment of a method for forming through silicon via interconnects.

FIGS. 14-18 illustrates yet another alternate embodiment of a method for forming vias. In FIG. 14, the IC structure is similar to the IC structure of FIG. 10. In this regard, the photoresist layer 202 is deposited directly on the exposed substrate portion 106, and is patterned to define an opening 1404 that exposes a portion of the substrate portion 106 having a first planar area.

Figure 15:
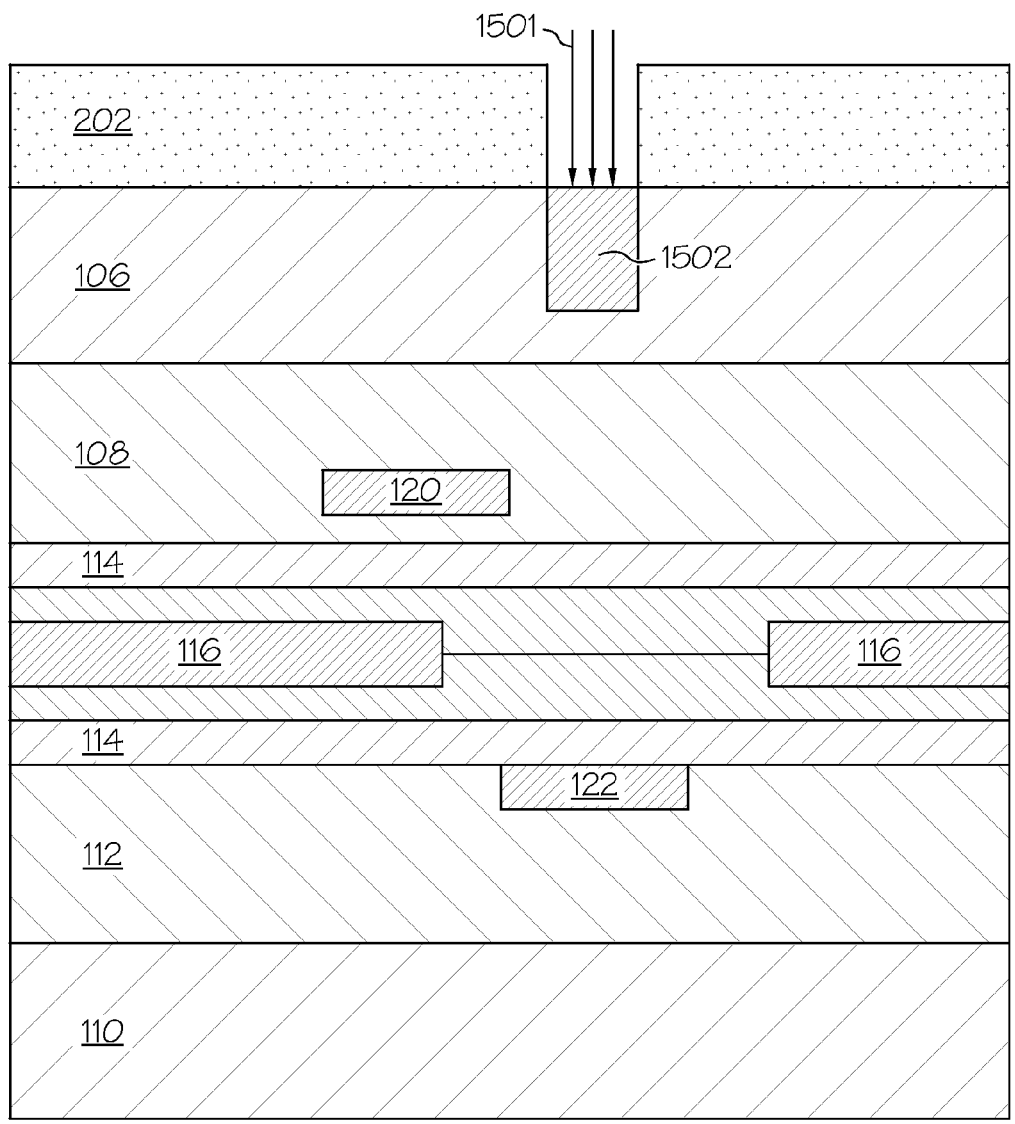

In FIG. 15, ions 1501 are implanted in the exposed portion of the substrate portion 106 to form a doped region 1502.

Figure 16:
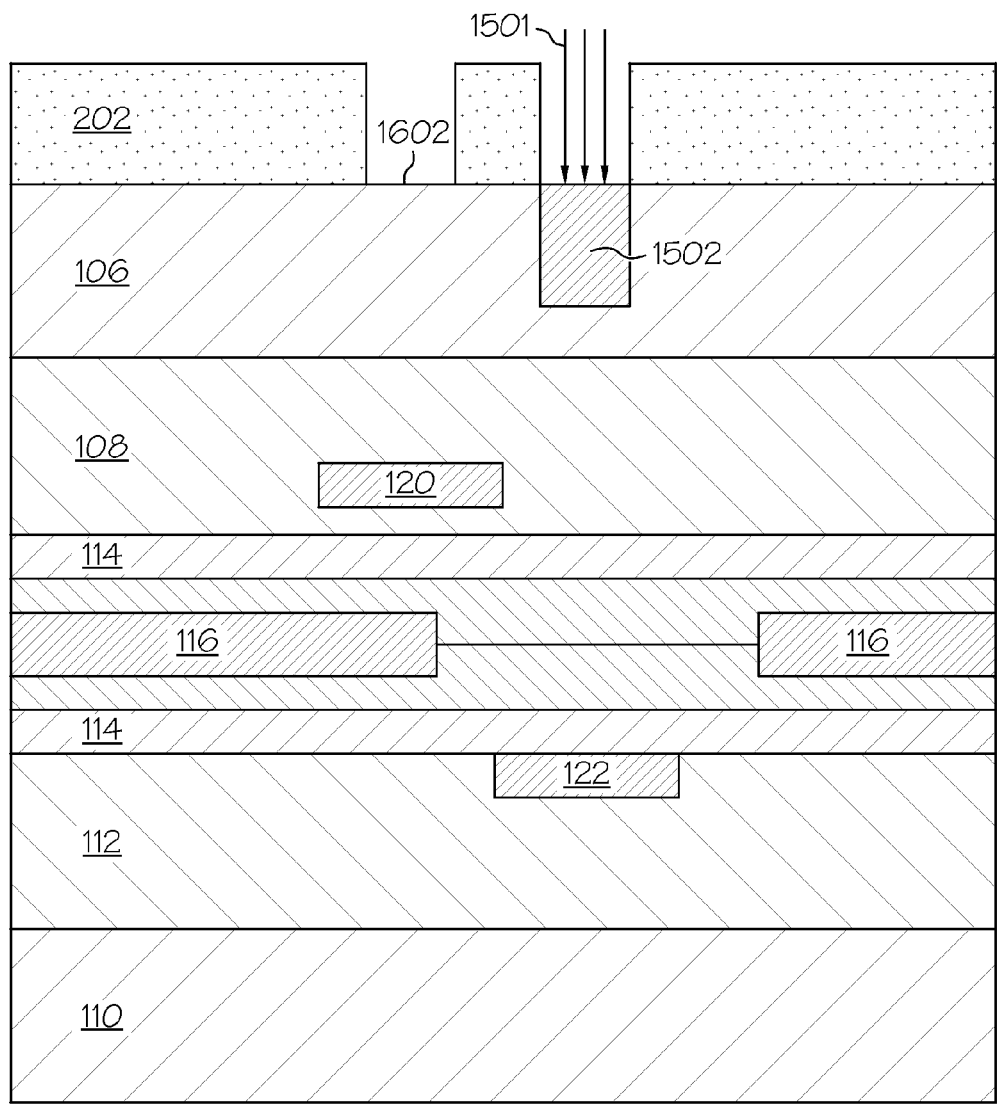

In FIG. 16, a portion of the photoresist layer 202 is removed to form an opening 1602. The opening 1602 exposes a second planar area of the substrate portion 106.

Figure 17:
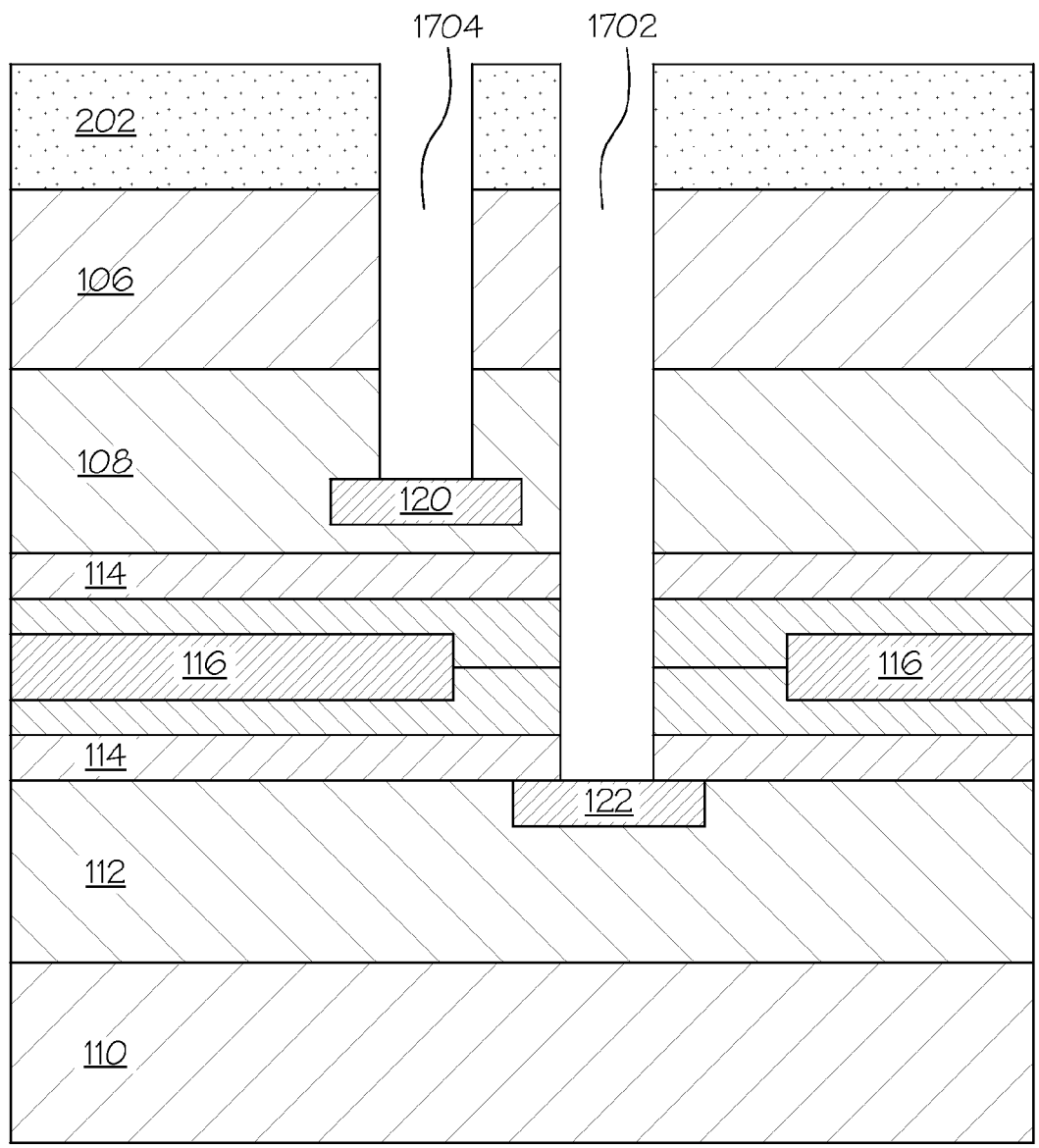

FIG. 17 illustrates resultant TSV cavities 1702 and 1704 following an etching process in which both TSVs are etched. The TSV cavities 1702 and 1704 may be etched concurrently. The TSV cavity 1702 exposes the conductive contact 120, and the TSV cavity 1704 exposes the conductive contact 122. The TSV cavity 1704 is etched at a faster rate than the TSV cavity 1702 due to the n-doped region 1502 (of FIG. 15). Alternatively, p-doing could also be used to retard the etch rate of the TSV formation as previously described.

Figure 18:
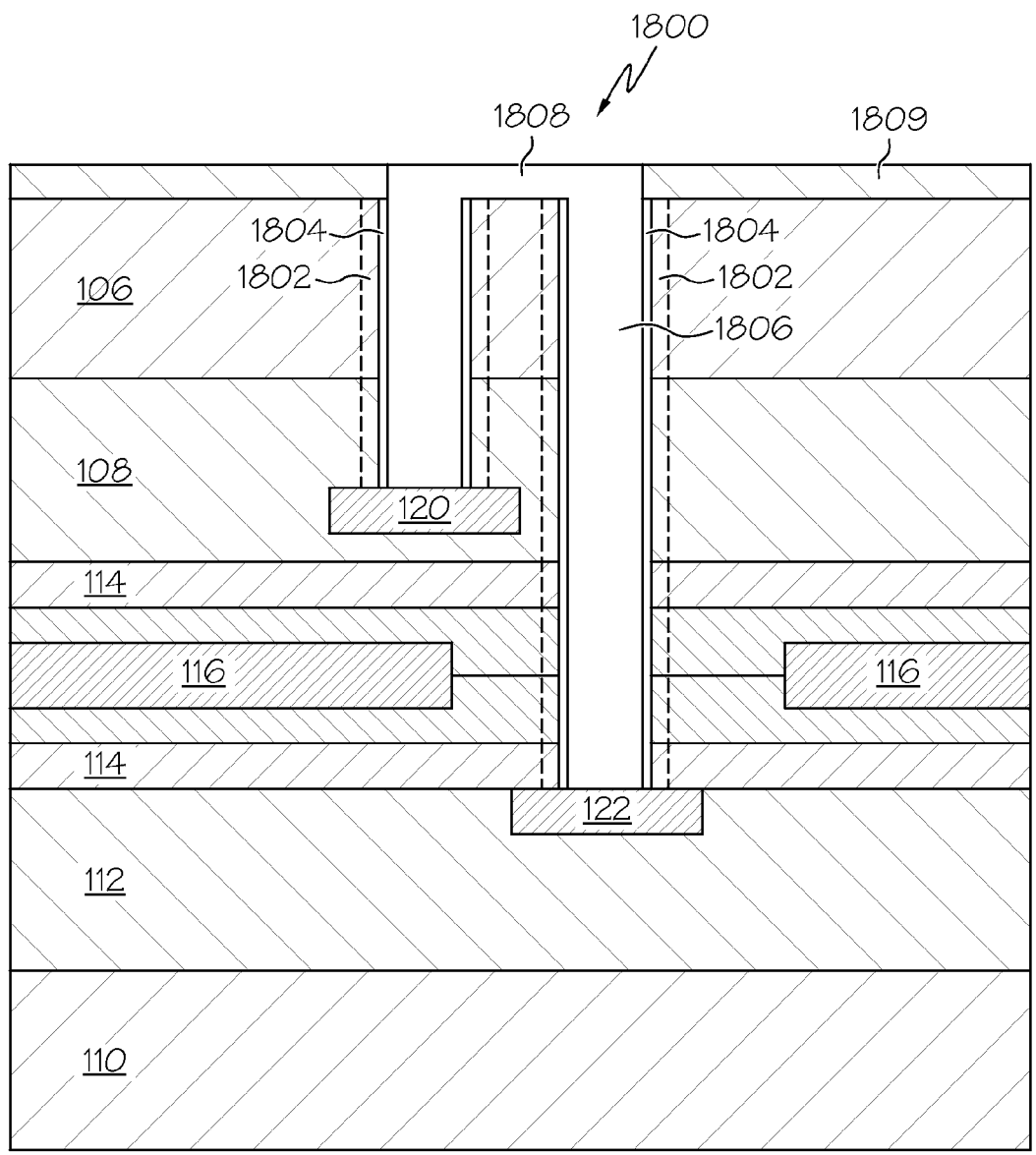

FIG. 18 illustrates resultant through silicon vias 1800. The vias 1800 may be formed by removing the photoresist layer 202, forming dielectric isolation regions 1802, and removing a portion of the dielectric isolation layer to expose portions of the contacts 120 and 122. A barrier/seed layer 1804 and a conductive material 1806 are deposited in the TSV cavities 1702 and 1704 to form the vias 1800. The vias may be connected by a conductive wiring level including the conductive line 1808, embedded in dielectric layer 1809. Wiring level may be formed utilizing standard damascene processing techniques known to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The description is presented for purposes of illustration, but is not intended to be exhaustive or to limit the invention in the form disclosed. Many modifications and variations will be apparent to those of ordinary skill in the art without departing from the scope and spirit of the invention.

The diagrams depicted herein are just examples. There may be many variations to the structure or the steps (or operations) described therein without departing from the spirit of the invention. For instance, the steps may be performed in a differing order or steps may be added, deleted or modified. All of these variations are considered a part of the claimed invention.

What is claimed is:

1. A method comprising:
    patterning a photoresist layer on a structure to define an opening and expose a first planar area on a first substrate layer, wherein the first substrate layer is a silicon layer;
    etching the exposed first planar area to form a cavity having a first depth in the structure;
    removing a portion of the photoresist to expose a second planar area on the substrate layer;
    implanting ions in an exposed portion of the second planar area to define an exposed doped portion of the first substrate layer and an exposed undoped portion of the first substrate layer;
    etching to remove the exposed doped portion of the first substrate layer; and
    etching the cavity to expose a first conductor in the structure and the doped portion to expose a second conductor in the structure.

2. The method of claim 1, wherein the structure includes a first wafer and a second wafer.

3. The method of claim 1, wherein the structure includes a first chip and a second chip.

4. The method of claim 1, wherein the structure has a substrate portion and a wiring level portion, and the substrate includes a silicon material.

* * * * *